United States Patent
Chakravarty et al.

(10) Patent No.: US 6,703,872 B2
(45) Date of Patent: Mar. 9, 2004

(54) HIGH SPEED, HIGH COMMON MODE RANGE, LOW DELAY COMPARATOR INPUT STAGE

(75) Inventors: Sujoy Chakravarty, Bangalore (IN); Pentakota A. Visvesvaraya, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/314,932

(22) Filed: Dec. 9, 2002

(65) Prior Publication Data

US 2003/0107409 A1 Jun. 12, 2003

Related U.S. Application Data

(60) Provisional application No. 60/339,965, filed on Dec. 10, 2001.

(51) Int. Cl.[7] ................................................. H03K 5/22
(52) U.S. Cl. ............................ 327/65; 327/563; 327/66
(58) Field of Search ............................... 327/63, 65, 66, 327/70, 89, 52, 53, 307, 563; 330/261

(56) References Cited

U.S. PATENT DOCUMENTS 5,451,898 A * 9/1995 Johnson ...................... 327/563
6,018,261 A * 1/2000 Alford et al. ............... 327/307

* cited by examiner

Primary Examiner—Long Nguyen
(74) Attorney, Agent, or Firm—Alan K. Stewart; W. James Brady, III; Frederick J. Telecky, Jr.

(57) ABSTRACT

The comparator input stage uses low voltage transistors 20 and 21 as the input pair. They have a small threshold voltage, and hence support a low common mode. The circuit includes a current sink 22 coupled to the input pair 20 and 21; a first resistor 33 coupled between a first branch of the input pair and a voltage node V24; a second resistor 36 coupled between a second branch of the input pair and the voltage node V24; a first transistor 23 coupled to the voltage node V24; a second transistor 24 having a gate coupled to a gate of the third transistor 23; a third resistor 32 coupled to a first end of the second transistor 24; and a current source 29 coupled to a second end of the second transistor 24 for controlling a voltage across the third resistor 32 wherein the voltage across the third resistor 32 sets a voltage at the voltage node V24. This voltage at the voltage node V24 serves as an open loop regulation for protection of the input pair transistors 20 and 21.

16 Claims, 1 Drawing Sheet

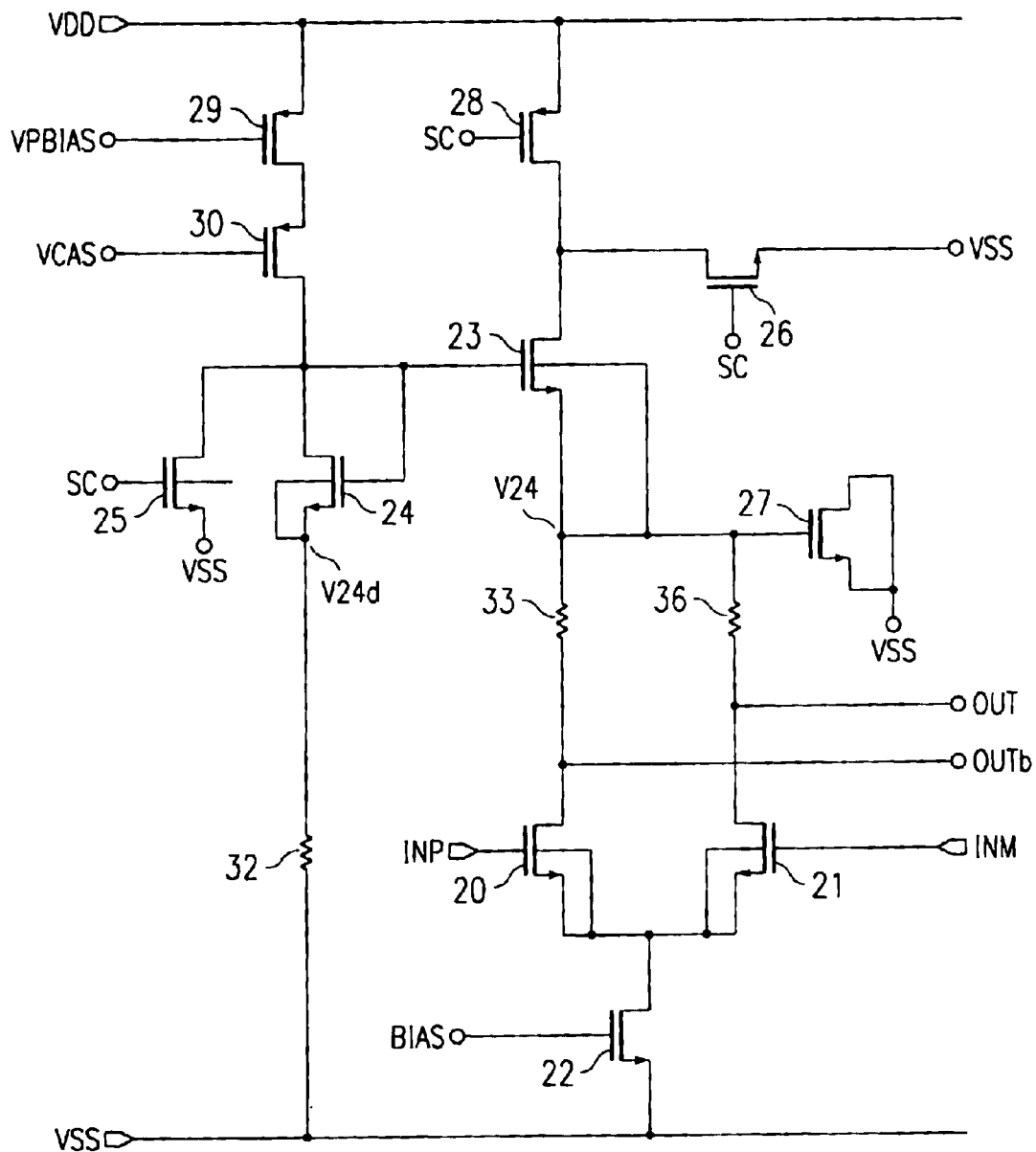

HIGH SPEED, HIGH COMMON MODE RANGE, LOW DELAY COMPARATOR INPUT STAGE

This application claims priority under 35 USC § 119 (e) (1) of provisional application No. 60/339,965 filed Dec. 10, 2001.

FIELD OF THE INVENTION

This invention generally relates to electronic systems and in particular it relates to a comparator input stage.

BACKGROUND OF THE INVENTION

One of the main problems with prior art comparators is the large common mode variation at the input stage of the comparator. This stage needs to support a common mode of 0.6V to 2.1V, with a differential swing as low as +/−25 mV. The next important point is the large variation in the supply voltage that the comparator should tolerate. For example, the supply voltage can vary from 2.7V to 3.6V.

To support the large common mode at the input (in the 1.8 v/3.3 v process) the supply must be 3.3 v. Hence, conventionally 3.3V transistors would be used as the input pair. Such transistors have a large threshold voltage (Vt), which prevents the N channel input pair from supporting a low common mode of 0.6V. If 1.8V transistors are instead used as the input pair, a lower common mode may be achieved, but the circuit shows reliability problems due to the use of a 3.3V supply.

In one prior art method used to solve the above problem, the input pair consists of two pairs of 3.3V transistors. One of the pairs consists of N channel input transistors, and the other pair consists of P channel input transistors. Depending on the common mode, the correct pair comes into operation. The problem with this method is that an extra comparator for every input is required.

Another prior art method is to use 1.8V N-channel input pair transistors with a resistor in the common current path, which drops a suitable amount of voltage across it. This method has its difficulties in this specific case because of the large power supply variation (the supply itself varies by 0.9V). This in effect means that it is impossible to determine the correct amount of voltage to be dropped across this resistor. If this dropped voltage is selected to be too small (for example ~0.4V or less), then for the supply voltage of 3.6V, there is still a reliability problem. On the other hand, if a larger value is dropped across the resistance, a curtailed common mode range is a problem at the higher end for a 2.7V supply voltage. Also, the output common mode of this stage is a function of the supply voltage and thus varies greatly.

Another prior art solution is a regulator with a 1.8V N-channel input pair. The regulator (closed loop, with an op-amp) is used to generate a suitable voltage (for example 2.4V) which is such a value as to not cause the reliability problem but at the same time not limit the upper side of the common mode range. This voltage is used as the supply for the comparator. However, this method requires the design of a dedicated regulator in closed loop for the comparator.

SUMMARY OF THE INVENTION

A comparator input stage uses low voltage transistors 20 and 21 as the input pair. They have a small threshold voltage, and hence support a low common mode. The circuit includes a current sink 22 coupled to the input pair 20 and 21; a first resistor 33 coupled between a first branch of the input pair and a voltage node V24; a second resistor 36 coupled between a second branch of the input pair and the voltage node V24; a first transistor 23 coupled to the voltage node V24; a second transistor 24 having a gate coupled to a gate of the third transistor 23; a third resistor 32 coupled to a first end of the second transistor 24; and a current source 29 coupled to a second end of the second transistor 24 for controlling a voltage across the third resistor 32 wherein the voltage across the third resistor 32 sets a voltage at the voltage node V24. This voltage at the voltage node V24 serves as an open loop regulation for protection of the input pair transistors 20 and 21.

BRIEF DESCRIPTION OF THE DRAWINGS

In the drawings:

FIG. 1 is a schematic circuit diagram of a preferred embodiment comparator input stage.

DETAILED DESCRIPTION OF PREFERRED EMBODIMENTS

A preferred embodiment comparator input stage is shown in FIG. 1. The circuit of FIG. 1 includes N channel transistors 20–27; P channel transistors 28–30; resistors 32, 33, and 36; output nodes OUT and OUTb; input nodes INP and INM; source voltages VDD and VSS; current bias nodes BIAS, VPBIAS, and VCAS; and switch control node SC.

The preferred embodiment solution uses 1.8V transistors 20 and 21 as the input pair. They have a small Vt (note also that the back gate is shorted to the source to remove the body bias and hence reduce Vt further), and hence support a low common mode down to less than 0.6V. For protection of transistors 20 and 21, a kind of regulation is used, but this is regulation in open loop.

The main consideration here is the very large range of input common mode that this stage needs to support (for example, 0.6V to 2V), and also the large variation in the supply voltage (for example, 2.7V to 3.6V). The lower end of the common mode range demands that 1.8V transistors 20 and 21 be used for the differential pair that are the first stage inputs. This leads to a condition though where the 1.8V input transistors 20 and 21 see the supply (for example, ~3.6V) across them, causing a reliability problem.

In the preferred embodiment first stage of the comparator shown in FIG. 1, the input differential pair is two N channel 1.8V analog friendly transistors (AFTs) 20 and 21 with the back gate connected back to source. This reduces the Vt (threshold voltage) and allows operation to lower common modes. The source voltage VDD may however go to, for example, 3.6V causing the reliability problem as mentioned above. This is avoided by holding node V24 to a lower voltage. In the preferred embodiment, this lower voltage is chosen to be approximately 2.4V so that the worst case voltage differential across the AFTs 20 and 21 does not cause a reliability problem.

The value at node V24 is controlled by pumping a current (for example, 40 uA in the preferred embodiment) through resistor 32 (for example, 60K ohms in the preferred embodiment) between node V24d and source voltage VSS. The current through resistor 32 is supplied a current source (transistors 29 and 30) which is controlled by node VPBIAS and VCAS. Sizes of transistor 24 and transistor 23 are ratioed according to the ratio of the current flowing through them. Thus from the structure of the circuit it is evident that node V24 is held at the same value as node V24d. Transistors 25, 26, and 28 whose gates are connected to node SC serve as switches that protect the AFTS 20 and 21.

The value of the resistors 33 and 36 and the current (decided by voltage BIAS and the lower current sink 22) are decided by the following factors: the speed at which the circuit needs to operate, the need that both transistors 20 and 21 in the input pair never enter the linear region together in the specified region of operation, and the desired gain.

The regulation is not required to be perfect but within a couple of 100 mV is enough for this purpose. The preferred embodiment eliminates the need for a specialized regulator for the comparator, and gives a large common mode range. This device has been proven on silicon for an input common mode range of 0.4V to 2.1V. Also, common mode variation at the output due to power supply variations is reduced to a very small amount. The regulation itself is done by using N-channel analog friendly transistors 20 and 21 with the back gate shorted to source (to reduce the Vt) so that it can still produce the desired voltage of 2.4V even with 2.7V supply. (The design is proven on silicon to work up to 2.6V). The design works at lower supply voltages but compromises on the upper end of the common mode range depending on the supply voltage.

This solution eliminates the need for a regulator. Also it requires only n-channel input transistors 20 and 21 in spite of the very large common mode range that it needs to support. This gives a direct reduction in the area and power for the comparators.

While this invention has been described with reference to an illustrative embodiment, this description is not intended to be construed in a limiting sense. Various modifications of the illustrative embodiment, as well as other embodiments of the invention, will be apparent to persons skilled in the art upon reference to the description. It is therefore intended that the appended claims encompass any such modifications or embodiments.

What is claimed is:

1. A circuit comprising:
    an input pair having first and second transistors and first and second output nodes;
    a current sink coupled to the input pair;
    a first resistor coupled between the first output node and a voltage node;
    a second resistor coupled between the second output node and the voltage node;
    a third transistor coupled to the voltage node;
    a fourth transistor having a gate coupled to a gate of the third transistor;
    a third resistor coupled to the fourth transistor; and
    a current source coupled to the fourth transistor for controlling a voltage across the third resistor wherein the voltage across the third resistor sets a voltage at the voltage node.

2. The circuit of claim 1 wherein the first and second transistors are MOS transistors.

3. The circuit of claim 1 wherein the first and second transistors are N channel transistors.

4. The circuit of claim 3 wherein backgates of the first and second transistors are coupled to the current sink.

5. The circuit of claim 3 wherein the first and second transistors are 1.8 volt transistors.

6. The circuit of claim 1 wherein the current sink is a transistor.

7. The circuit of claim 1 wherein the current sink is a MOS transistor.

8. The circuit of claim 1 wherein the current source is a transistor.

9. A comparator input stage comprising:
    an input pair having low voltage transistors;
    a current sink coupled to the input pair;
    a first resistor coupled between a first branch of the input pair and a voltage node;
    a second resistor coupled between a second branch of the input pair and the voltage node;
    a first transistor coupled to the voltage node;
    a second transistor having a gate coupled to a gate of the first transistor;
    a third resistor coupled to a first end of the second transistor; and
    a current source coupled to a second end of the second transistor for controlling a voltage across the third resistor wherein the voltage across the third resistor sets a voltage at the voltage node.

10. The circuit of claim 9 wherein the low voltage transistors are MOS transistors.

11. The circuit of claim 9 wherein the low voltage transistors are N channel transistors.

12. The circuit of claim 11 wherein backgates of the low voltage transistors are coupled to the current sink.

13. The circuit of claim 11 wherein the low voltage transistors are 1.8 volt transistors.

14. The circuit of claim 9 wherein the current sink is a transistor.

15. The circuit of claim 9 wherein the current sink is a MOS transistor.

16. The circuit of claim 9 wherein the current source comprises a transistor.

* * * * *